United States Patent
Yamamoto

(10) Patent No.: US 7,020,002 B2
(45) Date of Patent: Mar. 28, 2006

(54) SEMICONDUCTOR INTEGRATED CIRCUIT

(75) Inventor: Kenji Yamamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/962,447

(22) Filed: Oct. 13, 2004

(65) Prior Publication Data
US 2005/0117445 A1 Jun. 2, 2005

(30) Foreign Application Priority Data
Oct. 15, 2003 (JP) .............................. 2003-355730

(51) Int. Cl.
G11C 5/06 (2006.01)
(52) U.S. Cl. ............... 365/63; 365/230.02; 365/189.05
(58) Field of Classification Search .................. 365/63, 365/230.02, 189.08, 189.05
See application file for complete search history.

(56) References Cited

U.S. PATENT DOCUMENTS

| | | | | |
|---|---|---|---|---|
| 5,668,484 A | * | 9/1997 | Nomura ........................ | 326/93 |
| 6,043,704 A | * | 3/2000 | Yoshitake .................... | 327/565 |
| 6,311,313 B1 | * | 10/2001 | Camporese et al. ........... | 716/6 |
| 6,557,152 B1 | * | 4/2003 | Nakajima ...................... | 716/9 |
| 2003/0001652 A1 | * | 1/2003 | O'Mahony et al. ......... | 327/295 |

FOREIGN PATENT DOCUMENTS

JP 2003-152082 A 5/2003

* cited by examiner

Primary Examiner—Richard Elms
Assistant Examiner—Dang T. Nguyen
(74) Attorney, Agent, or Firm—Sughrue Mion, PLLC

(57) ABSTRACT

A semiconductor integrated circuit has a first clock distributing circuit and a second clock distributing circuit. The first clock distributing circuit is configured for distributing a first clock within a first region in a semiconductor chip. The second clock distributing circuit is configured for distributing a second clock within a second region in the semiconductor chip. The second region is located within the first region.

15 Claims, 8 Drawing Sheets

US 7,020,002 B2

SEMICONDUCTOR INTEGRATED CIRCUIT

BACKGROUND OF THE INVENTION

1. Field of the Invention

The present invention relates to a semiconductor integrated circuit and a method for laying-out a semiconductor integrated circuit. More particularly, the present invention relates to a master slice type semiconductor integrated circuit and a method for laying-out thereof.

2. Description of the Related Art

Conventionally, a master slice type semiconductor integrated circuit is known. According to the master slice type semiconductor integrated circuit, a master slice in which a plurality of cells with basic function such as logical gates, flip-flops and so on are formed on a semiconductor chip is prefabricated. After that, a wiring pattern for realizing a desired logic circuit requested by a customer is determined.

FIG. 1 is a plan view schematically showing an example of a configuration of such a master slice type semiconductor integrated circuit. As shown in FIG. 1, the semiconductor integrated circuit 100 has a plurality of cells 102 such as flip-flops which are arranged on a semiconductor chip 101. Also, a "clock tree" based on Clock Tree Synthesis (CTS) is arranged on the semiconductor chip 101, which distributes clock signals to respective of the plurality of cells 102. The clock signal is generated by a clock generating circuit such as a PLL (Phase Locked Loop) 103 and supplied to the clock tree on the semiconductor chip 101. The clock tree is configured to distribute the clock signal from a plurality of first clock buffers 104 in the center of the semiconductor chip 101 to a plurality of second clock buffers 106 through clock wirings 105. Similarly, a plurality of third clock buffers (not shown) may be arranged in order to distribute the clock signals from the second clock buffers 106. Eventually, the clock signals are distributed to respective of the plurality of cells 102.

Another master slice type semiconductor integrated circuit is disclosed in Japanese Laid Open Patent Application (JP-P2003-152082A). In the semiconductor integrated circuit, sequential circuit cells and combinational circuit cells are arranged in an inner core region on a semiconductor chip. The inner core region is sectioned into a plurality of regions. In order to selectively distribute multi-phase clock signals to each of the sectioned regions, a clock tree structure with the same load and the same wiring length is formed by using a plurality of first selectors, a plurality of second selectors and a plurality of third selectors. Each of the selectors selects any one of a plurality of inputted clock signals and outputs the selected clock signal, and hence one clock signal is distributed to desired one of the sectioned regions.

FIG. 2 is a circuit diagram showing a part of a clock tree structure according to the semiconductor integrated circuit 200 disclosed in the above document. Multi-phase clock signals CLK_A~CLK_H are externally supplied to each of first multiplexers MC101~MC104 (the first selectors). An output of each of the first multiplexers MC101~MC104 is distributed to each of second multiplexers MC201~MC204 (the second selectors). An output of each of the second multiplexers MC201 and MC202 is distributed to each of third multiplexers MC301 and MC302 (the third selectors), and an output of each of the second multiplexers MC203 and MC204 is distributed to each of third multiplexers MC303 and MC304 (the third selectors).

Here, three external control signals S0, S1 and S2 are supplied to each of the first multiplexers MC101~MC104, two external control signals S0 and S1 are supplied to each of the second multiplexers MC201~MC204, and an external control signal S0 is supplied to each of the first control signal S0. Thus, each of the first multiplexers MC101~MC104, the second multiplexers MS201~MC204 and the third multiplexers MC301~MC304 operates as a selector, selects any one of the clock signals CLK_A~CLK_H and outputs the selected clock signal. It should be noted that the external control signals inputted to respective multiplexers are controlled independently to be able to have different signal values.

For example, one of the first multiplexers MC101~MC104 selects and outputs the clock signal CLK_A when "000" are given as the three external control signals S0, S1 and S2, selects and outputs the clock signal CLK_B when "001" are given as the three external control signals S0, S1 and S2, and selects and outputs the clock signal CLK_C when "010" are given as the three external control signals S0, S1 and S2. Also, one of the second multiplexers MC201~MC204 selects and outputs the first input signal (for example, a clock signal from MC101 in the case of MC201) when "00" is given as the two external control signal S0 and S1, selects and outputs the second input signal (for example, a clock signal from MC102 in the case of MC201) when "01" is given as the two external control signal S0 and S1, and selects and outputs the third input signal (for example, a clock signal from MC103 in the case of MC201) when "10" is given as the two external control signal S0 and S1. Also, one of the third multiplexers MC301~MC304 selects and outputs the first input signal (for example, a clock signal from MC201 in the case of MC301) when "0" is given as the one external control signal S0, and selects and outputs the second input signal (for example, a clock signal from MC202 in the case of MC301) when "1" is given as the one external control signal S0.

Then, a clock signal which is selected by the multiplexers as mentioned above is distributed to any of the sectioned regions. For example, the clock signal CLK_A or CLK_B is selectively distributed to the sectioned regions (Area1 and Area2). The clock signal CLK_C or CLK_D is selectively distributed to the sectioned regions (Area3 and Area4). Each of these clock signals CLA_A~CLK_D is supplied to sequential circuit cells which are arranged in corresponding one of the sectioned regions.

There are problems with the above-mentioned conventional semiconductor integrated circuit in that clock skew between cells and electric power consumption increase since the multi-phase clock signals are distributed to all over the semiconductor chip. This problem still exists even if a clock tree is used between a clock input terminal and a clock output terminal (an input of each cell).

More specifically, according to the master slice type semiconductor integrated circuit 100 shown in FIG. 1, the clock signal has to be distributed to all over the semiconductor chip 101. Thus, as the area of the semiconductor chip 101 becomes wider, the clock wiring 105 becomes longer and the number of the clock buffers becomes larger, which causes the increase in electric power consumption. Moreover, as the number of steps of the clock buffer increases, the clock signal becomes more susceptible to dispersion of characteristics of transistors in the clock buffer, which causes larger clock skew.

According to the master slice type semiconductor integrated circuit 200 having the clock tree structure shown in FIG. 2, each of the first multiplexers MC101~MC104, the second multiplexers MC201~MC204 and the third multiplexers MC301~MC304 in the clock tree is configured to operate as a selector, namely, to select and output any one of the inputted clock signals. However, similar to the former master slice type semiconductor integrated circuit 100, there is still a problem that clock skew and electric power consumption increase as the semiconductor chip becomes larger.

SUMMARY OF THE INVENTION

It is therefore an object of the present invention to provide a semiconductor integrated circuit and a method for laying-out and manufacturing a semiconductor integrated circuit which can reduce clock delay, clock skew and electric power consumption.

In an aspect of the present invention, a semiconductor integrated circuit includes a first clock distributing circuit and a second clock distributing circuit. The first clock distributing circuit is configured for distributing a first clock (main clock) within a first region in a semiconductor chip. The second clock distributing circuit is configured for distributing a second clock (local clock) within a second region in the semiconductor chip. Here, the second region is located within the first region. The first region can be consistent with all over the semiconductor chip. The first clock distributing circuit and the second clock distributing circuit are formed based on CTS (Clock Tree Synthesis).

The semiconductor integrated circuit can further include a clock mesh wiring. The clock mesh is configured for shorting outputs of any one of the first clock distributing circuit and the second clock distributing circuit.

The semiconductor integrated circuit can further include a clock selector and a macro cell connected to the clock selector. The clock selector is connected to an output of the first clock distributing circuit and an output of the second clock distributing circuit. The clock selector receives the first clock and the second clock from the first clock distributing circuit and the second clock distributing circuit, respectively. The clock selector selects one clock from the first clock and the second clock based on a control signal, and outputs the one clock to the macro cell.

The semiconductor chip has a lower layer and an upper layer formed on the lower layer. The lower layer is incorporated within a master slice in which a prefabricated common wiring including the clock selector is formed. In this case, a control wiring for supplying the control signal to the clock selector is formed in the upper layer. More specifically, the control wiring is formed so as to connect the clock selector with at least one of power supply and ground.

In another aspect of the present invention, a semiconductor integrated circuit includes a first clock distributing circuit and a plurality of second clock distributing circuits. The first clock distributing circuit is configured for distributing a first clock within a first region in a semiconductor chip. The plurality of second clock distributing circuits are configured for distributing a second clock within a plurality of second regions in the semiconductor chip, respectively. Each of the plurality of second regions is within the first region. More specifically, the first region is sectioned into the plurality of second regions.

The semiconductor integrated circuit can further include a plurality of clock selectors and a macro cell connected to any of the plurality of clock selectors. The plurality of clock selectors are formed in the plurality of second regions, respectively. Each clock selector is connected to an output of the first clock distributing circuit and an output of corresponding one of the plurality of second clock distributing circuits. The clock selector receives the first clock and the second clock from the first clock distributing circuit and the one second clock distributing circuit, respectively. The clock selector selects one clock from the first clock and the second clock based on a control signal, and outputs the one clock to the macro cell.

The semiconductor chip has a lower layer and an upper layer formed on the lower layer. The lower layer is incorporated within a master slice in which a prefabricated common wiring including the plurality of clock selectors is formed. In this case, a control wiring for supplying the control signal to each clock selector is formed in the upper layer.

In still another aspect of the present invention, a semiconductor integrated circuit is manufactured on a semiconductor chip by using a master slice. The semiconductor chip has a lower layer incorporated within the master slice and an upper layer formed on the lower layer. In this case, the semiconductor integrated circuit includes a first clock distributing circuit and a second clock distributing circuit. The first clock distributing circuit is formed in the lower layer and is configured for distributing a first clock within a first region in the semiconductor chip. The second clock distributing circuit is formed in the lower layer and is configured for distributing a second clock within a second region in the semiconductor chip. The second region is located within the first region. The first clock distributing circuit and the second clock distributing circuit are formed based on CTS (Clock Tree Synthesis).

The semiconductor integrated circuit can further include a clock selector and a macro cell. The clock selector is formed in the lower layer and is connected to an output of the first clock distributing circuit and an output of the second clock distributing circuit. The macro cell is formed in the lower layer and is connected to the clock selector. The clock selector receives the first clock and the second clock from the first clock distributing circuit and the second clock distributing circuit, respectively. The clock selector selects one clock from the first clock and the second clock based on a control signal, and outputs the one clock to the macro cell. Here, a control wiring for supplying the control signal to the clock selector is formed in the upper layer.

In the semiconductor integrated circuit according to the present invention, sequential circuits and combinational circuits are arranged in an inner core region on the semiconductor chip. The inner core region (first region) is sectioned into a plurality of local regions (second regions). As mentioned above, this semiconductor integrated circuit has a main clock distributing circuit (first clock distributing circuit) and a plurality of local clock distributing circuits (second clock distributing circuits). The main clock distributing circuit distributes a main clock signal within all over the semiconductor chip. The plurality of local clock distributing circuits distributes local clocks within the plurality of local regions, respectively. Here, the main clock distributing circuit and the local clock distributing circuit are electrically independent of each other. Therefore, the clock delay, the clock skew and the electric power consumption are reduced.

DESCRIPTION OF THE PREFERRED EMBODIMENTS

Embodiments of the present invention will be described below with reference to the attached drawings.

In a master slice type semiconductor integrated circuit according to the present embodiment, a semiconductor chip is sectioned into a plurality of "local regions". Thus, each of the plurality of local regions is smaller than the size of the semiconductor chip. In the present specification, a clock signal distributed within all over the semiconductor chip (first region) is referred to as a "main clock signal (CLK_A, CLK_B)". On the other hand, a clock signal distributed within each local region (second region) is referred to as a "local clock signal (CLK_C, CLK_D)". The main clock signal (CLK_A, CLK_B) and the local clock signal (CLK_C, CLK_D) can have different frequency and phase.

Figure 1:
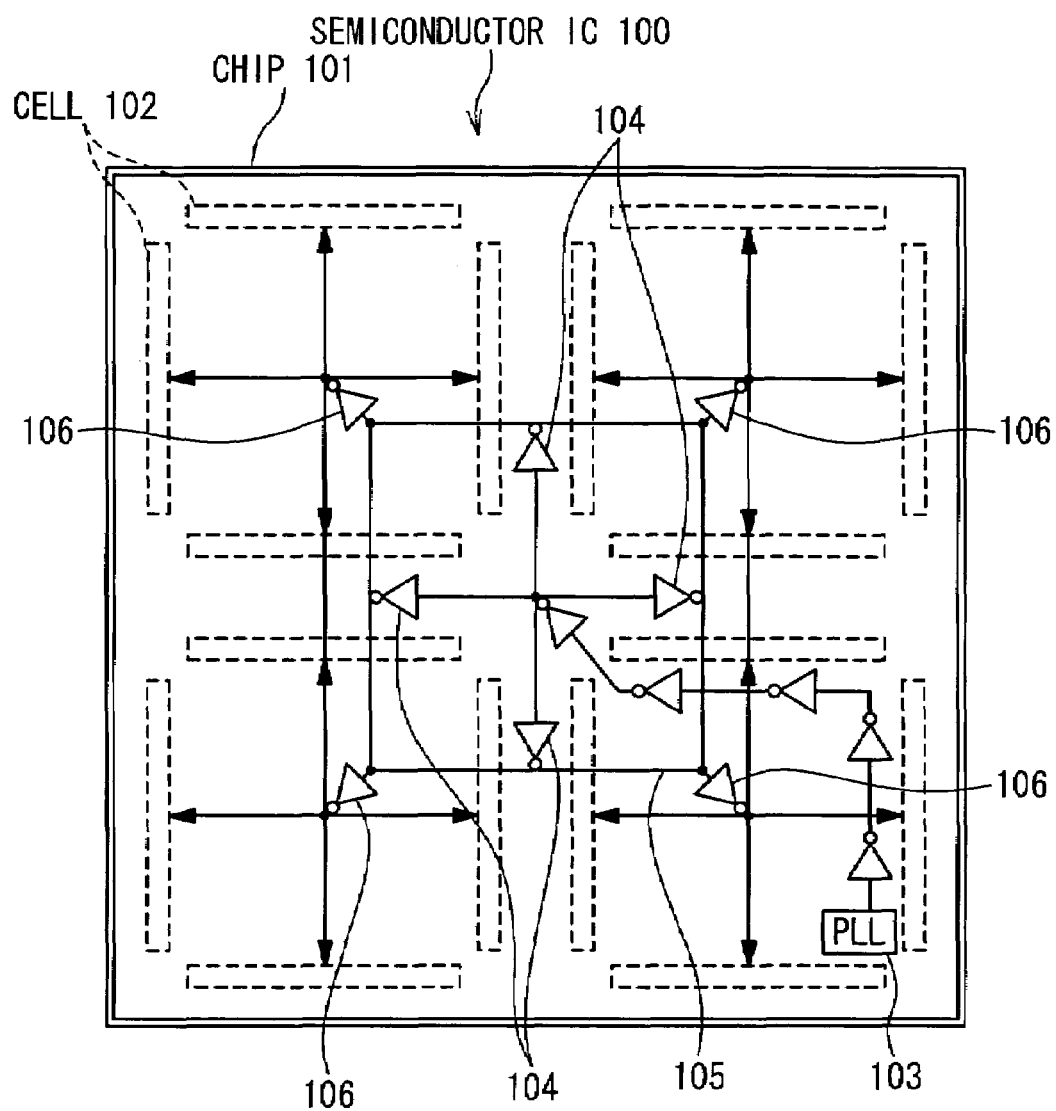
FIG. 1 is a plan view schematically showing a configuration of a conventional master slice type semiconductor integrated circuit.
Figure 2:
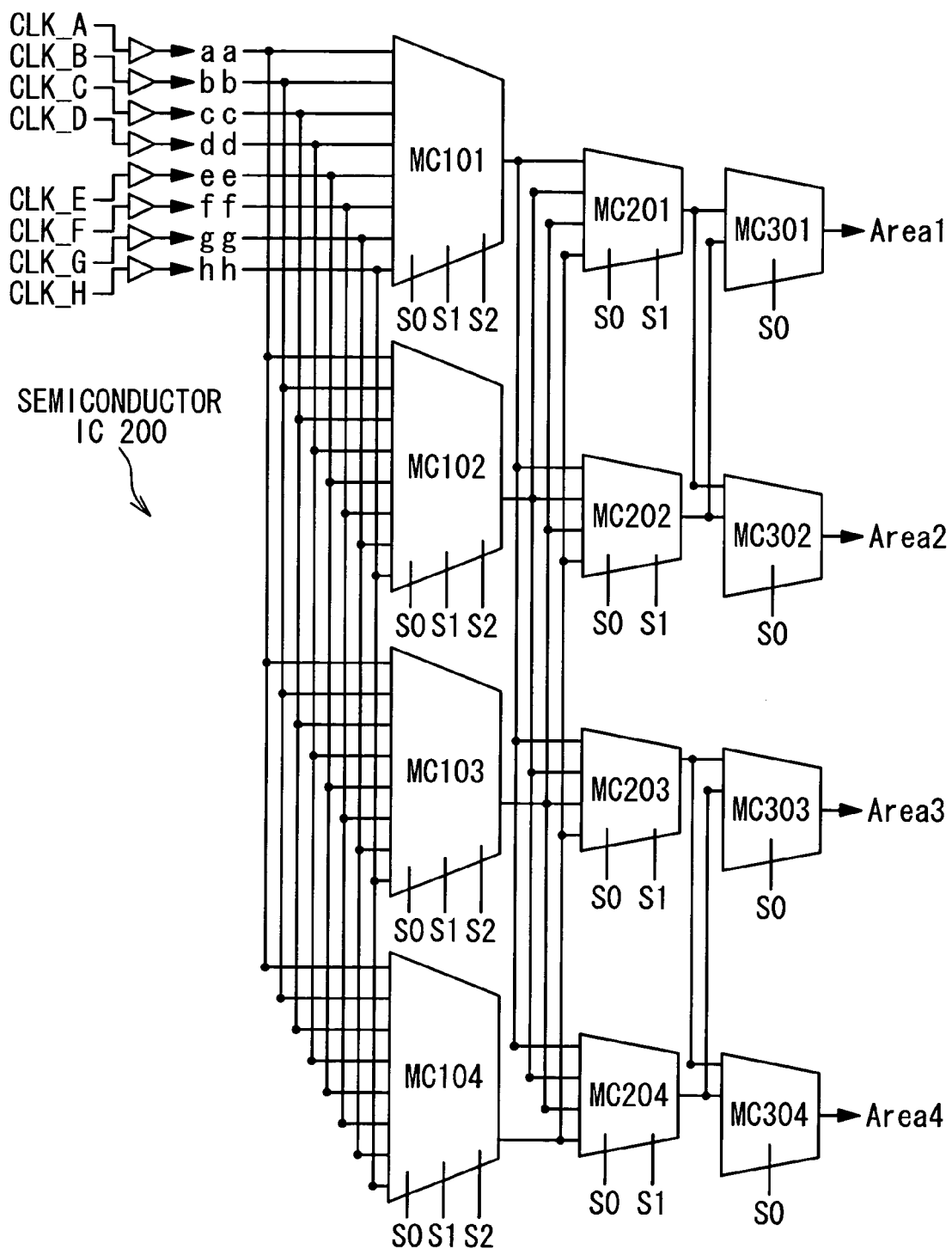
FIG. 2 is a circuit diagram showing a part of a clock tree according to a conventional master slice type semiconductor integrated circuit.
Figure 3:
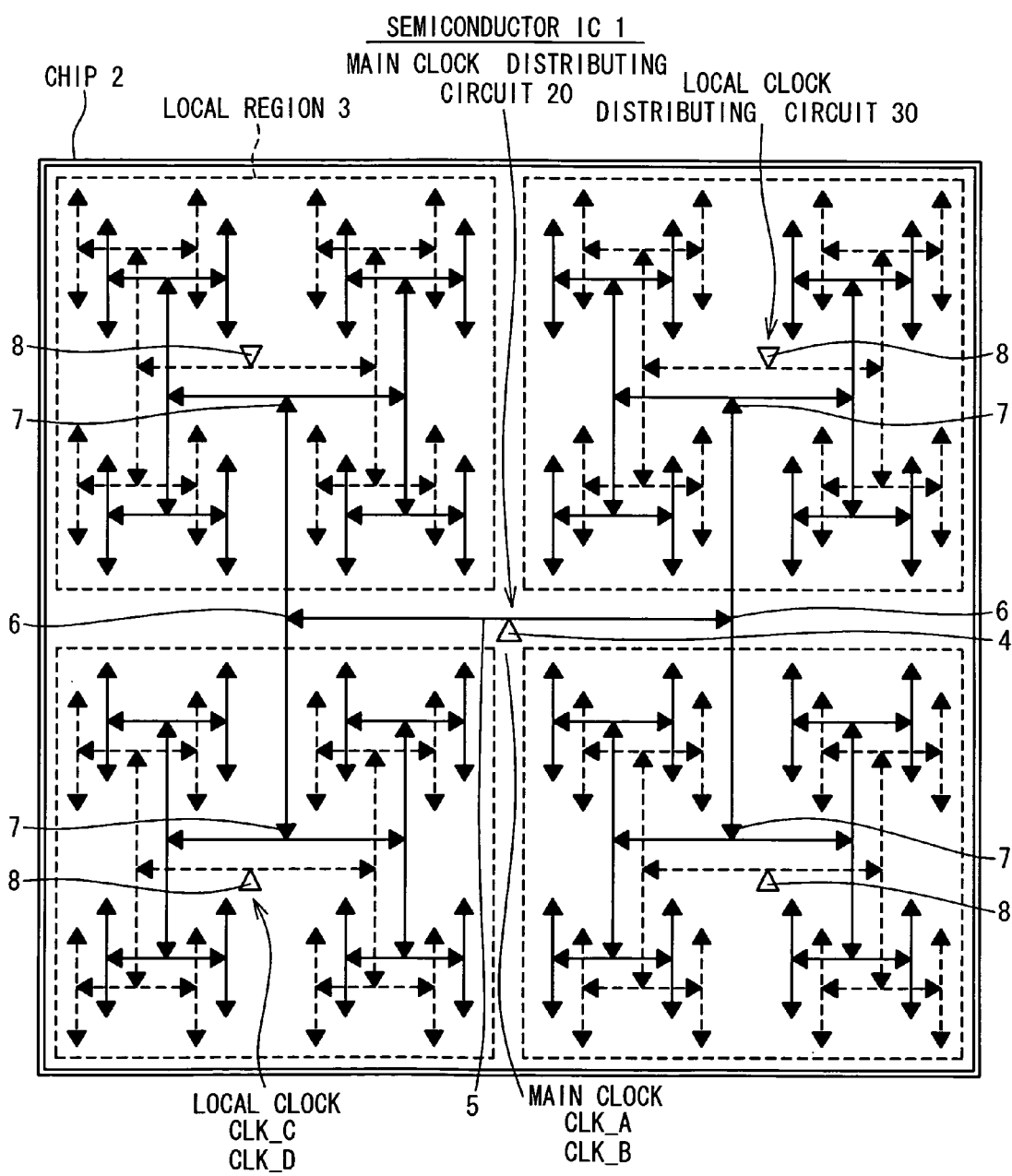
FIG. 3 is a plan view schematically showing a configuration of a master slice type semiconductor integrated circuit according to an embodiment of the present invention.

FIG. 3 is a plan view schematically showing a configuration of a master slice type semiconductor integrated circuit 1 according to an embodiment of the present invention. In the semiconductor integrated circuit 1, sequential circuits and combinational circuits are arranged in an inner core region of a semiconductor chip 2. The inner core region is sectioned into a plurality of local regions 3. This semiconductor integrated circuit 1 has a main clock distributing circuit 20 and a plurality of local clock distributing circuits 30. The main clock distributing circuit 20 distributes the main clock signals CLK_A and CLK_B within all over the semiconductor chip 2. The plurality of local clock distributing circuits 30 distribute the local clock signals CLK_C and CLK_D within the plurality of local regions 3, respectively.

The main clock distributing circuit 20 is indicated by solid lines in FIG. 3. As shown in FIG. 3, the main clock distributing circuit 20 is formed on the basis of CTS (Clock Tree Synthesis). The main clock signal CLK_A (CLK_B) is generated by a clock generating circuit such as a PLL circuit outside the semiconductor chip 2. The main clock signal CLK_A (CLK_B) is supplied to a clock tree from a main clock root buffer 4 (starting point) located in the center of the semiconductor chip 2. The main clock signal CLK_A (CLK_B) is distributed from the main clock root buffer 4 to a plurality of first clock buffers 6 (selectors) through a two-way branched clock wiring 5. Then, the main clock signal CLK_A (CLK_B) is distributed from each of the plurality of first clock buffers 6 to a plurality of second clock buffers 7 (selectors) through a two-way branched clock wiring 5. Eventually, a selected main clock signal is distributed to each of the plurality of local regions 3, and distributed to the sequential circuit cells provided in each local region 3. Thus, the plurality of clock buffers 6 and the plurality of clock buffers 7 are included in the clock tree. Each clock buffer has serially-connected two inverters.

The plurality of local clock distributing circuits 30 are indicated by dashed lines in FIG. 3. As shown in FIG. 3, each of the plurality of local clock distributing circuits 30 is formed on the basis of CTS (Clock Tree Synthesis). The local clock signal CLK_C (CLK_D) is generated by a clock generating circuit such as a PLL circuit outside the semiconductor chip 2. The local clock signal CLK_C (CLK_D) is supplied to a local clock tree from a local clock root buffer 8 (starting point) located in the center of each local region 3 in the semiconductor chip 2. The local clock signal CLK_C (CLK_D) is distributed from the local clock root buffer 8 to the sequential circuit cells provided in each local region 3 through clock wirings 5.

The main clock distributing circuit 20 and the local clock distributing circuit 30 are electrically independent of each other. Therefore, the main clock distributing circuit 20 and the local clock distributing circuit 30 can provide different clock signals (main clock and local clock) to a sequential circuit cell. Also, each clock distributing circuit has a clock tree structure, which makes it possible to distribute one clock signal to the plurality of local regions 3.

The main clock distributing circuit 20 and the local clock distributing circuit 30 are electrically independent of each other. Therefore, the local clock signals CLK_C and CLK_D can be distributed to the local clock tree in each local region 3 through the local clock root buffer 8 without using the main clock distributing circuit 20. Thus, according to the present invention, the scale of integrated circuit can be taken into consideration when planning the clock distribution, and the main clock distributing circuit 20 and the local clock distributing circuit 30 are used appropriately. It is therefore possible to reduce the clock delay and the clock skew by using the local clock distributing circuit 30. Furthermore, it is possible to distribute the local clock signals CLK_C and CLK_D directly to each local region 3 by using the local clock distributing circuit 30. Therefore, the electric power consumption is reduced.

Figure 4:
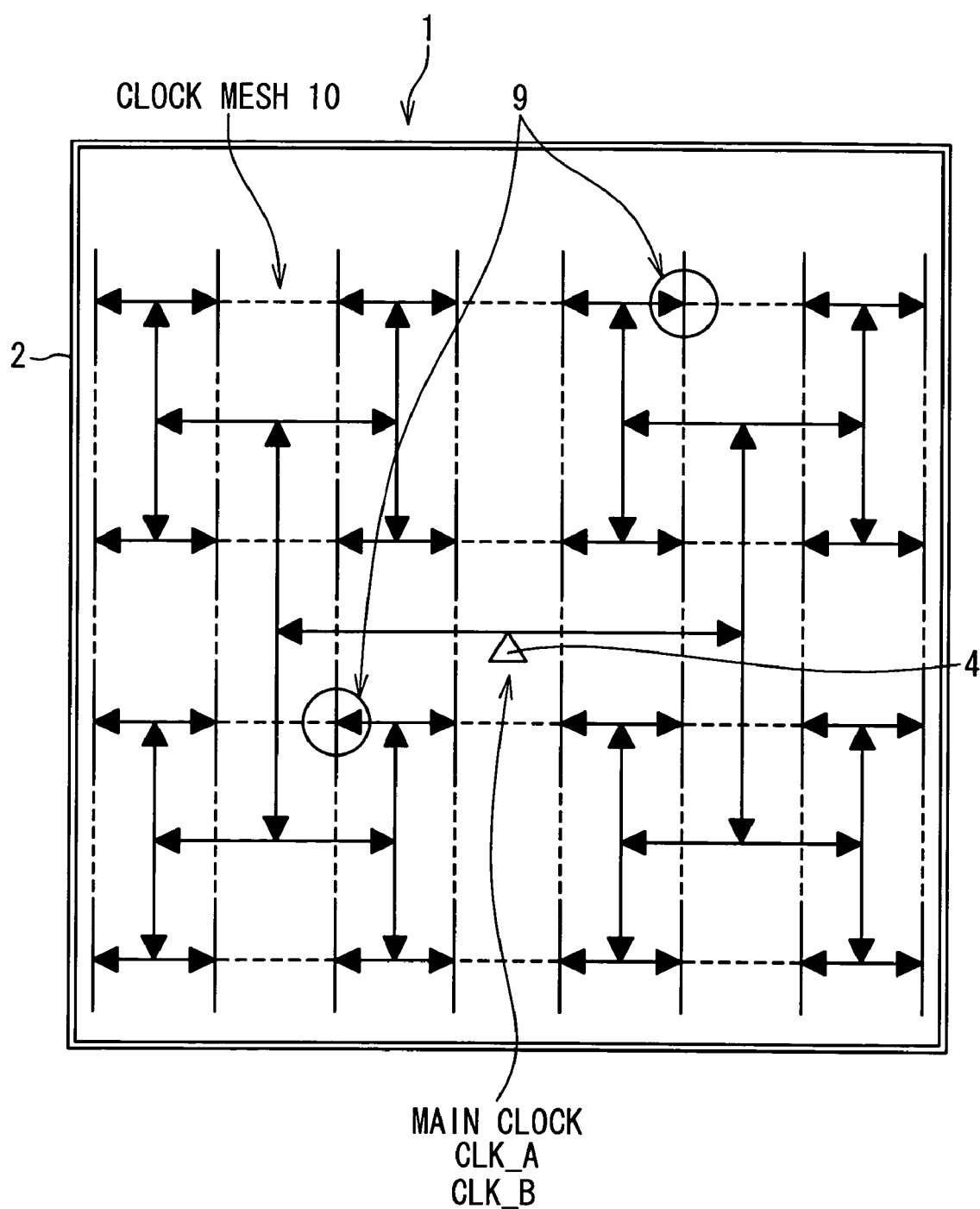
FIG. 4 is a plan view schematically showing another configuration of a master slice type semiconductor integrated circuit according to the present embodiment.

FIG. 4 is a plan view schematically showing another configuration of the master slice type semiconductor integrated circuit 1 according to the present embodiment. In FIG. 4, the description of the local clock distributing circuit 30 is omitted. This semiconductor integrated circuit 1 has a clock mesh wiring 10 which has a mesh pattern and is formed all over the semiconductor chip 2. Due to this clock mesh wiring 10, outputs of clock buffers 9 at the final stage are connected with each other. That is to say, the clock mesh wiring 10 shorts outputs of the main clock distributing circuit 20. This configuration makes it possible to prevent influence of dispersion of characteristics of transistors in the clock buffer. Thus, the clock skew is reduced. It should be noted that the clock mesh wiring 10 can be formed so as to short outputs of the local clock distributing circuit 30.

Figure 5:
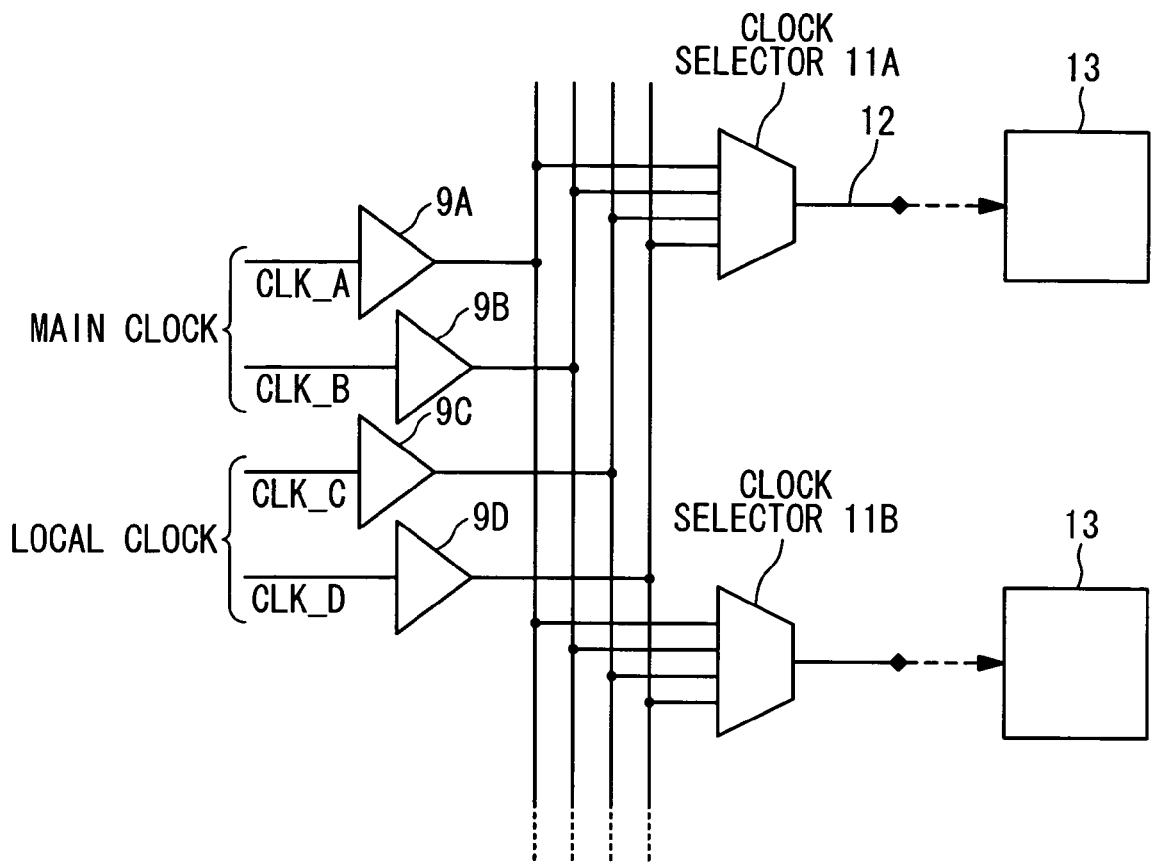
FIG. 5 is a circuit diagram showing a configuration of a circuit beyond clock distribution circuits in the semiconductor integrated circuit.

FIG. 5 is a circuit diagram showing a configuration of a circuit beyond the clock distribution circuits in the master slice type semiconductor integrated circuit 1 according to the present embodiment. In FIG. 5, the configuration beyond the clock buffer 9 at the final stage is shown. According to the present embodiment, at least one clock selector 11 is formed in each of the plurality of local regions 3. In FIG. 5, clock selectors 11A and 11B are shown, each of which is connected to a sequential circuit cell (macro cell) 13 through a leaf wiring 12. Each clock selector (11A, 11B) is also connected to outputs (9A, 9B) of the main clock distributing circuit 20 and outputs (9C, 9D) of the local clock distributing circuit 30.

Figure 6:
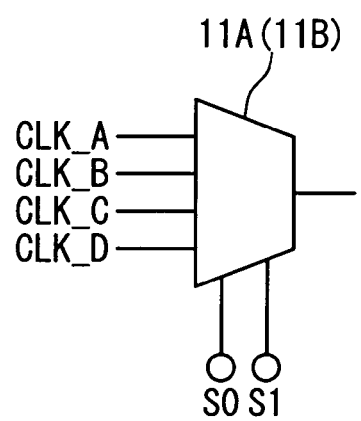
FIG. 6 is a schematic diagram showing a clock selector in the semiconductor integrated circuit.

FIG. 6 is a schematic diagram showing a clock selector 11 (11A, 11B) in FIG. 5. The clock selector 11 receives the main clock signal (CLK_A, CLK_B) from the main clock distributing circuit 20 and the local clock signal (CLK_C, CLK_D) from the local clock distributing circuit 30. The clock selector 11 also receives two control signals S0 and S1. Based on contents of the control signals S0 and S1, the clock selector 11 selects any one of the inputted clock signals CLK_A~CLK_D. Then, the clock selector 11 outputs the selected clock signal (CLA_A~CLK_D) to the sequential circuit cell 13.

For example, each clock selector 11 selects and outputs the main clock signal CLK_A when "00" is given as the control signals "S0, S1". Each clock selector 11 selects and outputs the main clock signal CLK_B when "01" is given as the control signals "S0, S1". Each clock selector 11 selects and outputs the local clock signal CLK_C when "10" is given as the control signals "S0, S1". Each clock selector 11 selects and outputs the local clock signal CLK_D when "11" is given as the control signals "S0, S1". It should be noted that which clock signal is selected depends on the specification of a semiconductor integrated circuit.

The semiconductor integrated circuit 1 according to the present embodiment is manufactured on the semiconductor chip 2 by using a "master slice". That is to say, a master slice in which a plurality of basic cells and common wirings are formed is first prefabricated and provided. After that, a wiring pattern for realizing a desired logic circuit requested by a customer is formed on the master slice.

Figure 7:
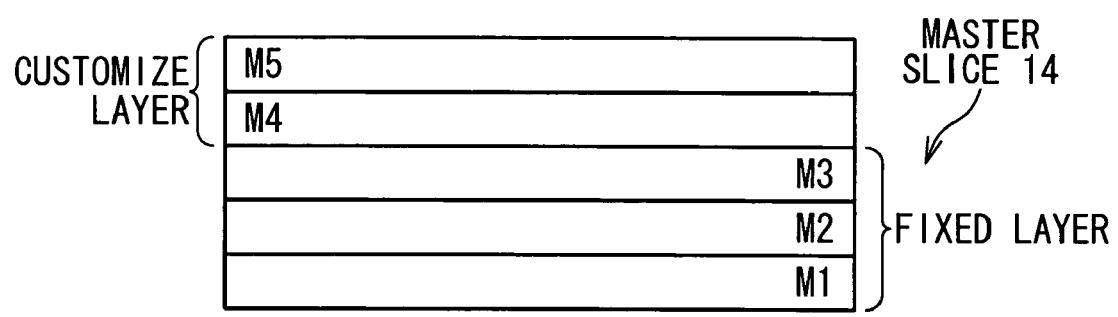
FIG. 7 is a cross sectional view schematically showing a structure of the master slice type semiconductor integrated circuit according to the embodiment of the present invention.

FIG. 7 is a cross sectional view schematically showing a structure of the master slice type semiconductor integrated circuit 1 according to the present embodiment. As shown in FIG. 7, the semiconductor integrated circuit 1 has five layers M1~M5. The lower layers M1~M3 are incorporated within the master slice 14 and referred to as "fixed layers". In the fixed layers M1~M3, the above-mentioned main clock distribution circuit 20, the plurality of local clock distribution circuits 30, the plurality of clock selectors 11, the plurality of macro cells 13, test circuit wirings, a power supply wiring, a ground wiring and so on are prefabricated. The fixed layers M1~M3 are used in common for manufacturing different semiconductor integrated circuits. On the other hand, the upper layers M4 and M5 formed on the fixed layers M1~M3 are referred to as "customize layers". In the customize layers M4 and M5, customized wirings can be formed according to a request of a customer.

As mentioned above, each clock selector 11 operates depending on the two control signals S0 and S1 (see FIG. 6). Here, the clock selector 11 is connected to two control wirings, and the control signals S0 and S1 are supplied to the clock selector 11 through the two control wirings, respectively. For example, when a control wiring is connected to the power supply, the corresponding control signal is set to "1". On the other hand, when a control wiring is connected to the ground, the corresponding control signal is set to "0". In the present embodiment, the control wirings are formed in the above-mentioned customize layers M4 and M5. Therefore, the control signals (S0, S1), namely, each clock selectors 11 can be set flexibly to satisfy the request of a customer. That is to say, each control wiring for supplying a control signal (S0, S1) is formed to be connected with either the power supply or the ground according to the request of the customer.

An output of each clock selector 11 (11A, 11B) is connected to 20~30 sequential circuit cells 13, and a selected clock signal is distributed to the sequential circuit cells 13. Here, the clock signal may not be necessary in some of the sequential circuit cells 13. Therefore, each of the sequential circuit cells 13 is configured such that the usage of the clock signal can be controlled. In one state, the clock signal is supplied and used within a sequential circuit cell 13, and hence the sequential circuit cell 13 operates. In the other state, a fixed potential is supplied within a sequential circuit cell 13 instead of the clock signal, and the sequential circuit cell 13 does not operate. Which sequential circuit cells 13 will operate is determined based on a specification of a semiconductor integrated circuit requested by a customer.

Figure 8A:
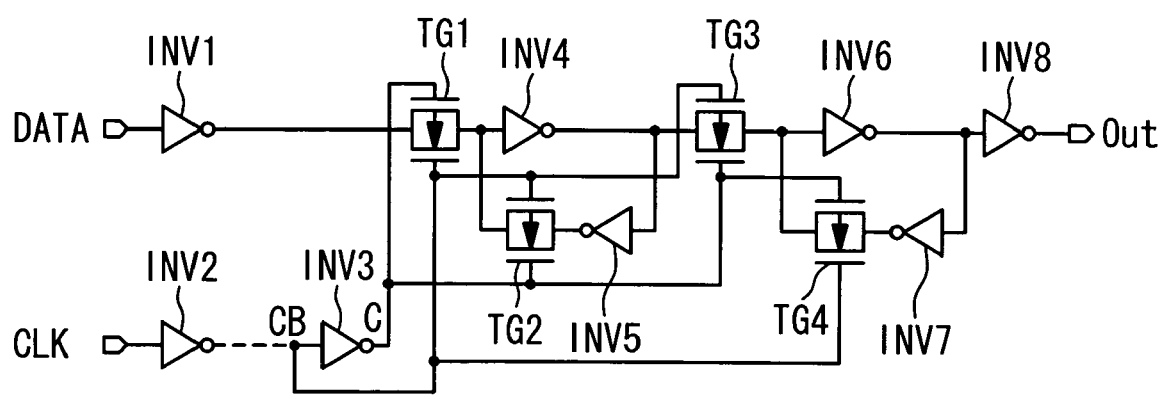
FIG. 8A is a circuit diagram showing an example of a sequential circuit cell in the semiconductor integrated circuit.
Figure 8B:
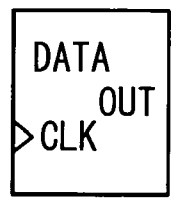
FIG. 8B shows a circuit symbol of the sequential circuit cell in FIG. 8A.

FIG. 8A is a circuit diagram showing an example of a configuration of a sequential circuit cell 13, and FIG. 8B shows a circuit symbol of the sequential circuit cell 13 in FIG. 8A. The sequential circuit cell 13 shown in FIG. 8A has inverters INV1~INV8 and transmission gates TG1~TG4, which constitutes a D flip-flop.

At the process of forming the sequential circuit cells and the combinational circuit cells on the semiconductor chip 2, an output terminal of the inverter INV2 in a clock input section remains unconnected with an input terminal of the inverter INV3, as shown by a dashed line in FIG. 8A. At the next process (wiring process), a wiring pattern which connects the output terminal of the inverter INV2 in the clock input section and the input terminal of the inverter INV3 is formed for a sequential circuit cell 13 to be operated. On the other hand, as for a sequential circuit cell 13 which is not operated, the output terminal of the inverter INV2 remains unconnected with the input terminal of the inverter INV3. Instead, a wiring pattern which connects the input terminal CB of the inverter INV3 and either the power supply or the ground is formed.

Figure 9A:
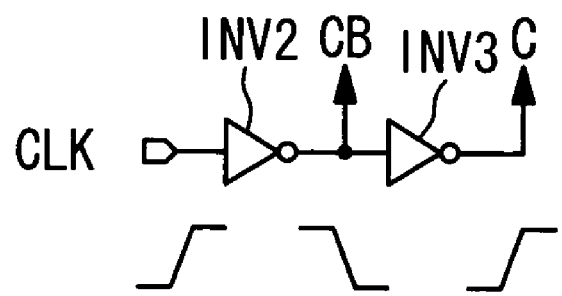
FIG. 9A is a schematic picture for explaining an operation of the sequential circuit cell in FIG. 8A.
Figure 9B:
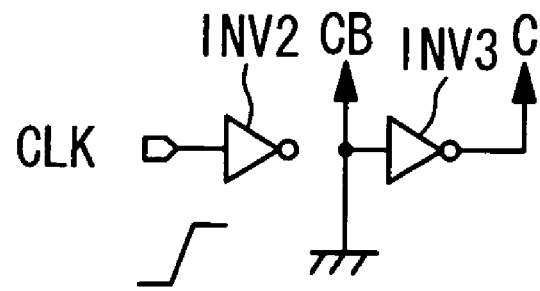
FIG. 9B is a schematic picture for explaining an operation of the sequential circuit cell in FIG. 8A.

Thus, in the clock input section of the sequential circuit cell 13 to be operated, the potentials at the input terminal CB and an output terminal C of the inverter INV3 vary in response to the clock signal CLK as shown in FIG. 9A. On the other hand, in the clock input section of the sequential circuit cell 13 which is not operated, the potentials at the input terminal CB and an output terminal C of the inverter INV3 remain unchanged as shown in FIG. 9B, and hence no switching is carried out in response to the clock signal CLK.

As described above, in each sequential circuit cell 13 connected to an output of each clock selector 11, the usage of the clock signal CLK can be controlled. As for a sequential circuit cell 13 which is not operated, the output terminal of the inverter INV2 remains unconnected with the input terminal of the inverter INV3. That is to say, the inverter INV3 and the transmission gates TG1~TG4 in such a residual cell 13 do not become loads. Thus, the electric power consumption is particularly reduced.

Next, a method for laying-out the semiconductor integrated circuit 1 according to the present embodiment will be described below. First, the sequential circuit cells and the combinational circuit cells are arranged in the inner core region on the semiconductor chip 2. Next, the inner core region is sectioned into the plurality of local regions 3 according to kinds of clock signals used in the semiconductor integrated circuit 1. Next, the above-mentioned main clock distributing circuit 20 and the above-mentioned local clock distributing circuit 30 are arranged in the semiconductor chip based on the CTS (Clock Tree Synthesis). Here, the main clock distributing circuit 20 and the local clock distributing circuit 30 are formed so as to be electrically independent of each other.

A method for manufacturing the master slice type semiconductor integrated circuit 1 according to the present embodiment is as follows. First, a master slice is prefabricated and provided. As mentioned above, this master slice includes the main clock distributing circuit 20, the plurality of local clock distributing circuits 30, the plurality of clock selectors 11 and the plurality of macro cells 13. After that, the control wirings each of which supplies a control signal to a clock selector 11 are formed on the master slice. That is, each control wiring is formed such that a clock selector 11 is connected to at least one of the power supply and the ground.

As described above, according to the master slice type semiconductor integrated circuit 1 and the method for laying-out and manufacturing thereof, the clock delay and the clock skew are reduced. Moreover, the electric power consumption is reduced.

In the above embodiment, the two-phase main clock signal (CLK_A, CLK_B) and the two-phase local clock signal (CLK_C, CLK_D) are shown. Here, the number of phases of the clock signal can be set to an arbitrary value. Also, in the case when only one kind of clock signal is supplied to the sequential circuit cells, the clock selector 11 is unnecessary. It will be obvious to one skilled in the art that the present invention may be practiced in other embodiments that depart from the above-described specific details. The scope of the present invention, therefore, should be determined by the following claims.

What is claimed is:

1. A semiconductor integrated circuit comprising:
   a first clock distributing circuit configured for distributing a first clock signal from a buffer for a first clock within a first region in a semiconductor chip; and
   a second clock distributing circuit configured for distributing a second clock signal from a buffer for a second clock within a second region in said semiconductor chip,
   wherein said second region is located within said first region, said second clock is within said second region,
   wherein said second clock is independent of said first clock.

2. The semiconductor integrated circuit according to claim 1,
   wherein said first region is all over said semiconductor chip.

3. The semiconductor integrated circuit according to claim 1,
   wherein said first clock distributing circuit and said second clock distributing circuit are formed based on CTS (Clock Tree Synthesis).

4. The semiconductor integrated circuit according to claim 1, further comprising a clock mesh wiring configured for shorting outputs of any one of said first clock distributing circuit and said second clock distributing circuit.

5. The semiconductor integrated circuit according to claim 1, further comprising:
   a clock selector connected to an output of said first clock distributing circuit and an output of said second clock distributing circuit; and
   a macro cell connected to said clock selector,
   wherein said clock selector receives said first clock and said second clock from said first clock distributing circuit and said second clock distributing circuit, respectively, selects one clock from said first clock and said second clock based on a control signal, and outputs said one clock to said macro cell.

6. The semiconductor integrated circuit according to claim 5,
   wherein said semiconductor chip includes:
   a lower layer incorporated within a master slice in which a prefabricated common wiring including said clock selector is formed; and
   an upper layer formed on said lower layer,
   wherein a control wiring for supplying said control signal to said clock selector is formed in said upper layer.

7. The semiconductor integrated circuit according to claim 6,
   wherein said control wiring connects said clock selector with at least one of power supply and ground.

8. A semiconductor integrated circuit comprising:
   a first clock distributing circuit configured for distributing a first clock signal from a buffer for a first clock within a first region in a semiconductor chip; and
   a plurality of second clock distributing circuits configured for distributing a second clock signal from a buffer for a plurality of second clocks within a plurality of second regions in said semiconductor chip, respectively,
   wherein each of said plurality of second regions is within said first region, said plurality of second clocks are respectively within said plurality of second regions,
   wherein said plurality of second clocks are independent of said first clock.

9. The semiconductor integrated circuit according to claim 8,
   wherein said first region is sectioned into said plurality of second regions.

10. The semiconductor integrated circuit according to claim 8, further comprising:
    a plurality of clock selectors formed in said plurality of second regions, respectively; and
    a macro cell connected to any of said plurality of clock selectors,
    wherein said each clock selector is connected to an output of said first clock distributing circuit and an output of corresponding one of said plurality of second clock distributing circuits, receives said first clock and said second clock from said first clock distributing circuit and said one second clock distributing circuit, respectively, selects one clock from said first clock and said second clock based on a control signal, and outputs said one clock to said macro cell.

11. The semiconductor integrated circuit according to claim 10,
    wherein said semiconductor chip includes:
    a lower layer incorporated within a master slice in which a prefabricated common wiring including said plurality of clock selectors is formed; and
    an upper layer formed on said lower layer,
    wherein a control wiring for supplying said control signal to said each clock selector is formed in said upper layer.

12. A semiconductor integrated circuit, manufactured on a semiconductor chip by using a master slice, said semiconductor chip including a lower layer incorporated within said master slice and an upper layer formed on said lower layer, comprising:
    a first clock distributing circuit formed in said lower layer and configured for distributing a first clock signal from a buffer for a first clock within a first region in said semiconductor chip; and a second clock distributing circuit formed in said lower layer and configured for distributing a second clock signal from a buffer for a second clock within a second region in said semiconductor chip, wherein said second region is located within said first region, said second clock is within said second region, wherein said second clock is independent of said first clock.

13. The semiconductor integrated circuit according to claim 12, wherein said first clock distributing circuit and said second clock distributing circuit are formed based on CTS (Clock Tree Synthesis).

14. The semiconductor integrated circuit according to claim 12, further comprising:

a clock selector formed in said lower layer and connected to an output of said first clock distributing circuit and an output of said second clock distributing circuit; and a macro cell formed in said lower layer and connected to said clock selector, wherein said clock selector receives said first clock and said second clock from said first clock distributing circuit and said second clock distributing circuit, respectively, selects one clock from said first clock and said second clock based on a control signal, and outputs said one clock to said macro cell.

15. The semiconductor integrated circuit according to claim 14, wherein a control wiring for supplying said control signal to said clock selector is formed in said upper layer.

* * * * *